(12) United States Patent
Lee et al.

(10) Patent No.: US 12,125,954 B2
(45) Date of Patent: Oct. 22, 2024

(54) SEMICONDUCTOR LIGHT EMITTING DEVICE PACKAGE

(71) Applicant: SAMSUNG ELECTRONICS CO., LTD., Suwon-si (KR)

(72) Inventors: Junghun Lee, Suwon-si (KR); Kyoungjun Kim, Yongin-si (KR); Sun Kim, Hwaseong-si (KR); Seolyoung Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 399 days.

(21) Appl. No.: 17/689,026

(22) Filed: Mar. 8, 2022

(65) Prior Publication Data

US 2023/0011141 A1    Jan. 12, 2023

(30) Foreign Application Priority Data

Jul. 9, 2021    (KR) .......................... 10-2021-0090339

(51) Int. Cl.
*H01L 33/56* (2010.01)
*H01L 25/13* (2006.01)
(Continued)

(52) U.S. Cl.
CPC .............. *H01L 33/56* (2013.01); *H01L 25/13* (2013.01); *H01L 33/06* (2013.01); *H01L 33/32* (2013.01);
(Continued)

(58) Field of Classification Search
CPC ......... H01L 33/56; H01L 25/13; H01L 33/06; H01L 33/32; H01L 33/44; H01L 33/486;
(Continued)

(56) References Cited

U.S. PATENT DOCUMENTS

| 6,372,608 | B1 | 4/2002 | Shimoda et al. |
| 6,645,830 | B2 | 11/2003 | Shimoda et al. |

(Continued)

FOREIGN PATENT DOCUMENTS

| KR | 10-1637327 B1 | 7/2016 |
| KR | 10-2017-0014709 A | 2/2017 |

(Continued)

*Primary Examiner* — J. E. Schoenholtz
(74) *Attorney, Agent, or Firm* — Muir Patent Law, PLLC

(57) ABSTRACT

A semiconductor light emitting device package includes a circuit board with an upper pad, a light emitting diode chip on the circuit board and having a first surface facing the circuit board and a second surface opposing the first surface, and the light emitting diode chip including a substrate, a semiconductor stack structure on the substrate that emits ultraviolet light, and electrodes connected to the semiconductor stack structure, connection bumps between the circuit board and the light emitting diode chip, the connection bumps connecting the upper pad and the electrodes, an underfill resin on the upper pad of the circuit board and covering at least a portion of a side surface of the light emitting diode chip, and a passivation layer on the light emitting diode chip and the underfill resin, the passivation layer covering the underfill resin and being spaced apart from the semiconductor stack structure.

20 Claims, 7 Drawing Sheets

(51) Int. Cl.
*H01L 33/06* (2010.01)
*H01L 33/32* (2010.01)
*H01L 33/44* (2010.01)
*H01L 33/48* (2010.01)
*H01L 33/62* (2010.01)

(52) U.S. Cl.
CPC ............ *H01L 33/44* (2013.01); *H01L 33/486* (2013.01); *H01L 33/62* (2013.01); *H01L 2933/0025* (2013.01); *H01L 2933/005* (2013.01)

(58) Field of Classification Search
CPC ............. H01L 33/62; H01L 2933/0025; H01L 2933/005; H01L 2933/0033; H01L 33/54; H01L 33/52
See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,471,282 B2 | 6/2013 | Diana et al. |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,169,273 B2 | 10/2015 | Kim et al. |
| 10,333,025 B1 | 6/2019 | Park et al. |
| 10,483,433 B2 | 11/2019 | Park et al. |
| 10,862,004 B2 | 12/2020 | Park et al. |
| 2013/0234274 A1 | 9/2013 | Kam et al. |
| 2016/0315068 A1 | 10/2016 | Lee et al. |
| 2018/0052275 A1* | 2/2018 | Lee ................. G02B 6/0073 |
| 2019/0355783 A1 | 11/2019 | Koh |
| 2021/0098671 A1* | 4/2021 | Kawano ............ H01L 33/36 |
| 2023/0178702 A1* | 6/2023 | Nakabayashi .......... H01L 33/60 |
| | | | 257/79 |

FOREIGN PATENT DOCUMENTS

| | | |
|---|---|---|
| KR | 10-2019-0070533 A | 6/2019 |
| KR | 10-2019-0073908 A | 6/2019 |
| KR | 10-2019-0073909 A | 6/2019 |

* cited by examiner

SEMICONDUCTOR LIGHT EMITTING DEVICE PACKAGE

CROSS-REFERENCE TO RELATED APPLICATION

This application claims benefit of priority to Korean Patent Application No. 10-2021-0090339, filed on Jul. 9, 2021, in the Korean Intellectual Property Office, the disclosure of which is incorporated herein by reference in its entirety.

BACKGROUND

1. Field

Embodiments relate to a semiconductor light emitting device package.

2. Description of the Related Art

Semiconductor light emitting devices are known as next-generation light sources having advantages such as long lifespan, low power consumption, fast response speeds, environmental friendliness, and the like, compared to conventional light sources. Semiconductor light emitting devices are attracting attention not only as lighting sources, e.g., for general lighting devices, display devices, and electric lamps for vehicles, but also as various functional light sources, e.g., a light source for sterilization, a light source for plant growth promotion, and a light source for bio-related matters. Such semiconductor light emitting devices require a reliable package structure together with light extraction efficiency.

SUMMARY

According to an aspect of embodiments, a semiconductor light emitting device package includes a circuit board having an upper pad; a light emitting diode chip mounted on the circuit board, including a substrate, a semiconductor stack structure disposed on the substrate and configured to emit ultraviolet light, and electrode structures connected to the semiconductor stack structure, and having a first surface facing the circuit board and a second surface opposing the first surface; connection bumps disposed between the circuit board and the light emitting diode chip and connecting the upper pad and the electrode structures; an underfill resin disposed on the upper pad of the circuit board and covering at least a portion of a side surface of the light emitting diode chip; and a passivation layer disposed on the light emitting diode chip and the underfill resin, covering the underfill resin, and spaced apart from the semiconductor stack structure.

According to an aspect of embodiments, a semiconductor light emitting device package includes a circuit board; a light emitting diode chip mounted on the circuit board, including a first surface facing the circuit board and a second surface opposing the first surface, and configured to emit ultraviolet light; an underfill resin disposed on the circuit board and covering at least a portion of a side surface of the light emitting diode chip; and a passivation layer disposed on the light emitting diode chip and the underfill resin and covering the second surface of the light emitting diode chip and the underfill resin.

According to an aspect of embodiments, a semiconductor light emitting device package includes a circuit board having an upper pad; a light emitting diode chip mounted on the circuit board, including a substrate, a semiconductor stack structure disposed on the substrate and configured to emit ultraviolet light, and electrode structures connected to the semiconductor stack structure, and having a first surface facing the circuit board and a second surface opposing the first surface; connection bumps disposed between the circuit board and the light emitting diode chip and connecting the upper pad and the electrode structures; an underfill resin disposed on the upper pad of the circuit board, covering a side surface of the semiconductor stack structure and the connection bumps, and including a fluoropolymer; and a passivation layer covering the second surface of the light emitting diode chip and the underfill resin, extending onto an upper surface of the circuit board, and including at least aluminum oxide.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
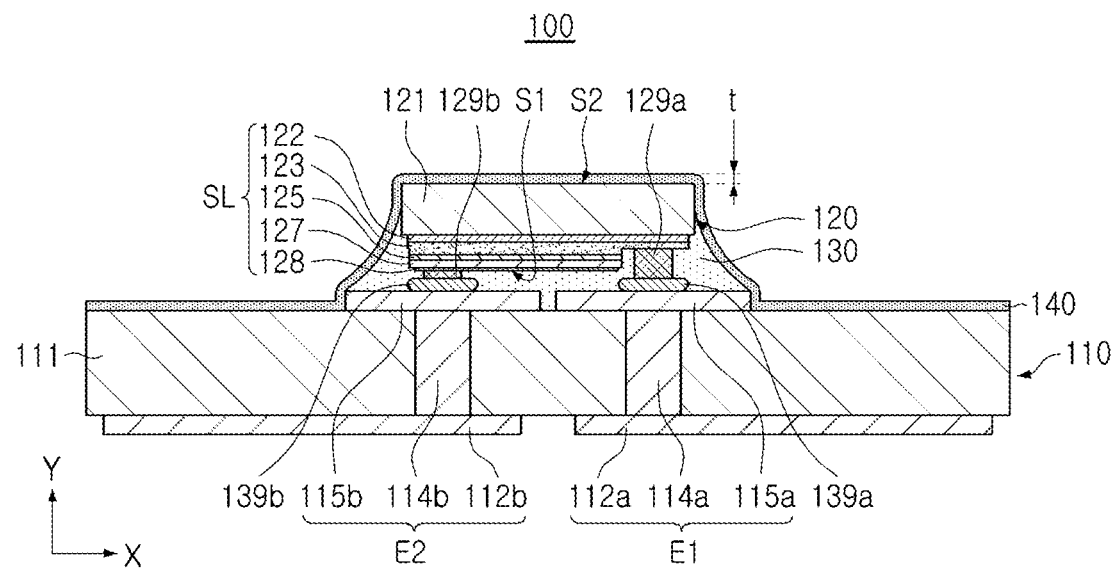
FIG. 1 is a cross-sectional view of a semiconductor light emitting device package according to an embodiment.

FIG. 1 is a cross-sectional view of a semiconductor light emitting device package according to an embodiment.

Referring to FIG. 1, a semiconductor light emitting device package 100 according to this embodiment may include a circuit board 110, a light emitting diode (LED) chip 120 mounted on the circuit board 110, an underfill resin 130 disposed on the circuit board and covering a side surface of the LED chip 120, and a passivation layer 140 disposed on the underfill resin 130. The semiconductor light emitting device package 100 may further include connection bumps 139a and 139b disposed between the circuit board 110 and the LED chip 120.

The circuit board 110 may include a first electrode structure E1 and a second electrode structure E2. The circuit board 110 may be a board, e.g., a printed circuit board (PCB), a metal core PCB (MCPCB), a metal PCB (MPCB), a flexible PCB (FPCB), or the like. A structure of the circuit board 110 may be applied in various forms.

The first and second electrode structures E1 and E2 may include first and second upper pads 115a and 115b disposed on an upper surface of a board body 111, first and second lower pads 112a and 112b disposed on a lower surface of the board body 111, and first and second through-electrodes 114a and 114b passing through the board body 111 and respectively connected to the first and second upper pads 115a and 115b and the first and second lower pads 112a and 112b, respectively. For example, the first and second upper pads 115a and 115b, the first and second through-electrodes 114a and 114b, and the first and second lower pads 112a and 112b may include a conductive material, e.g., Au, Ag, Cu, Zn, Al, In, Ti, Si, Ge, Sn, Mg, Ta, Cr, W, Ru, Rh, Ir, Ni, Pd, or Pt, as a single layer structure or a multilayer structure.

For example, the first and second upper pads 115a and 115b, the first and second through-electrodes 114a and 114b, and the first and second lower pads 112a and 112b may be separately manufactured, respectively. In another example, the first and second upper pads 115a and 115b, the first and second through-electrodes 114a and 114b, and the first and second lower pads 112a and 112b may be manufactured at one time, e.g., simultaneously, through a batch process. For example, the first and second electrode structures E1 and E2 may be formed by a plating process using a metal, e.g., copper (Cu). For example, the first and second upper pads 115a and 115b may include a Cu plating layer and an Au/Ni plating layer or an Au/Pd/Ni plating layer stacked on the Cu plating layer. In this case, the first and second upper pads 115a and 115b may be pads for connecting to electrodes of the LED chip 120, and may be also referred to as "first and second electrode pads," respectively.

In this embodiment, the LED chip 120 may be mounted on the circuit board 110 by a flip-chip bonding method. The LED chip 120 may have a first surface S1 facing the circuit board 110 and a second surface S2 opposing the first surface S1. The LED chip 120 may include first and second electrodes 129a and 129b disposed on the first surface S1 facing an upper surface of the circuit board 110. The first and second electrodes 129a and 129b of the LED chip 120 may be electrically connected to the first and second electrode structures E1 and E2 by the connection bumps 139a and 139b, respectively. The first and second electrodes 129a and 129b of the LED chip 120 may be connected to the first and second upper pads 115a and 115b by the connection bumps 139a and 139b, respectively. The LED chip 120 may be configured to emit light within a specific wavelength band. In some embodiments, the LED chip 120 may be configured to emit ultraviolet light (e.g., a wavelength of 100 nm to 400 nm). In certain instances, the LED chip 120 may be configured to emit short-wave ultraviolet (UV-C) light for sterilization and disinfection purposes (e.g., a wavelength of 100 nm to 300 nm).

The LED chip 120 in this embodiment may include a substrate 121 and a semiconductor stack structure SL disposed on the substrate 121 and configured to emit ultraviolet light. The semiconductor stack structure SL may include first and second conductivity-type semiconductor layers 123 and 127, and an active layer 125 disposed between the first and second conductivity-type semiconductor layers 123 and 127. The first conductivity-type semiconductor layer 123 may be disposed on the substrate 121, the active layer 125 may be disposed on the first conductivity-type semiconductor layer 123, and the second conductivity-type semiconductor layer 127 may be disposed on the active layer 125.

In the LED chip 120, layers having different widths in one direction may be stacked to form a stepped structure on a side surface. For example, as illustrated in FIG. 1, the LED chip 120 may include a stack of elements having different widths in the X-axis direction, e.g., the LED chip 120 may include a stack of layers having increasing widths in the X-axis direction when stacked away from the circuit board 110, such that a side profile in a cross-section of the LED chip 120, e.g., in the X-axis direction, may have a stepped structure. For example, a width of the second surface S2 may be narrower, e.g., smaller, than a width of the first surface S1 of the LED chip 120, e.g., in the X-axis direction. For example, a width of the first conductivity-type semiconductor layer 123 may be narrower, e.g., smaller, than a width of the substrate 121, and a width of the second conductivity-type semiconductor layer 127 may be narrower, e.g., smaller, than the width of the first conductivity-type semiconductor layer 123, e.g., in the X-axis direction. In the semiconductor stack structure SL, layers having different widths in one direction may be stacked to form a stepped structure. For example, the width of the first conductivity-type semiconductor layer 123 may be narrower than a width of a buffer layer 122, e.g., a width of a portion of the first conductivity-type semiconductor layer 123 may be narrower than a maximal width of a buffer layer 122. For example, a width of the active layer 125 may be narrower than the width of the first conductivity-type semiconductor layer 123, e.g., the width of the active layer 125 may be narrower than the maximal width of the first conductivity-type semiconductor layer 123. For example, the width of the second conductivity-type semiconductor layer 127 may be narrower than the width of the first conductivity-type semiconductor layer 123, e.g., the width of the second conductivity-type semiconductor layer 127 may be narrower than the maximal width of the first conductivity-type semiconductor layer 123.

The substrate 121 may be a growth substrate for the semiconductor stack structure SL, and may be, e.g., an insulating substrate, a conductive substrate, or a semiconductor substrate. For example, the substrate 121 may be sapphire, AlN, SiC, $MgAl_2O_4$, MgO, $LiAlO_2$, or $LiGaO_2$. The semiconductor stack structure SL in this embodiment may include the buffer layer 122 for growing a high-quality AlGaN semiconductor on the substrate 121. For example, the buffer layer 122 may be formed of a nitride, e.g., AlN or AlGaN. The first conductivity-type semiconductor layer 123 may be an n-type nitride semiconductor represented by $Al_{x1}Ga_{1-x1}N$ (0<x1≤1), and the n-type impurity may be Si. For example, the first conductivity-type semiconductor layer 123 may include n-type AlGaN. The second conductivity-type semiconductor layer 127 may be a p-type nitride semiconductor expressed by $Al_{x2}Ga_{1-x2}N$ (0<x2≤1), and the p-type impurity may be Mg. For example, the second conductivity-type semiconductor layer 127 may include p-type AlGaN. In an example, an Al composition ratio in the first and second conductivity-type semiconductor layers 123 and 127, i.e., the value of each of x1 or x2, may be independently 0.45 to 0.99. For example, an Al composition ratio (x1) in the first conductivity-type semiconductor layers 123 may be 0.60 to 0.65, and an Al composition ratio (x2) in the second conductivity-type semiconductor layer 127 may be 0.75 to 0.85.

The active layer 125 in this embodiment may have a quantum well formed of $Al_{x3}Ga_{1-x3}N$ (0<x3<1). The active layer 125 may be a single-quantum well structure (SQW) having a single quantum well, but is not limited thereto, and the active layer 25 may be a multi-quantum well structure (MQW) in which a plurality of quantum well layers formed of $Al_{xa}Ga_{1-xa}N$ (0<xa<1) and a plurality of quantum barrier layers formed of $Al_{xb}Ga_{1-xb}N$ (0<xb<1) are alternately stacked.

The quantum well of the active layer 125 may have a band gap that determines a wavelength of the ultraviolet light, and the active layer 125 in this embodiment may be configured to emit light having a wavelength of 100 nm to 400 nm, or a wavelength of 100 nm to 300 nm. The first and second conductivity-type semiconductor layers 123 and 127 have a band gap greater than that of the quantum well such that ultraviolet light generated from the active layer 125 is not absorbed. For example, an Al composition ratio, i.e., the value of x3 or xa, in the quantum well may be smaller than the Al composition ratio, i.e., the values of x1 or x2, in the first and second conductivity-type semiconductor layers 123 and 127. In an example, the Al composition ratio, i.e., the values of x3 or xa, in the quantum well may be in the range of 0.4 to 1.00, and the Al composition ratio may be adjusted according to a desired wavelength.

When the second conductivity-type semiconductor layer 127 is formed of p-type AlGaN, it may be difficult to form an ohmic contact with a common electrode material. The semiconductor stack structure SL in this embodiment may include a second conductivity-type contact layer 128 formed on the second conductivity-type semiconductor layer 127 and having a relatively low band gap. An Al composition ratio in the second conductivity-type contact layer 128 may be smaller than the Al composition ratio (x2) in the second conductivity-type semiconductor layer 127, and may include, e.g., p-type GaN.

The LED chip 120 according to this embodiment may include first and second electrodes 129a and 129b respectively connected to the first and second conductivity-type semiconductor layers 123 and 127. The semiconductor stacked structure SL may have a region in which the second conductivity-type semiconductor layer 127 and the active layer 125 may be partially removed to have a region to which the first conductivity-type semiconductor layer 123 is exposed. The first electrode 129a may be disposed on the exposed region of the first conductivity-type semiconductor layer 123. For example, the first and second electrodes 129a and 129b may have a multilayer structure formed of Al, Ti, Ni, Cr, Au, Ag, or ITO, or a combination thereof. For example, the first electrode 129a may include Ti/Al/Ni/Au, and the second electrode 129b may include Ag or Ni/Au.

The connection bumps 139a and 139b may be disposed between the circuit board 110 and the LED chip 120. The connection bumps 139a and 139b may connect the first and second electrodes 129a and 129b of the LED chip 120 and the first and second electrode structures E1 and E2, respectively. The connection bumps 139a and 139b may connect the first and second electrodes 129a and 129b of the LED chip 120 and the first and second upper pads 115a and 115b, respectively.

The connection bumps 139a and 139b may be a metal bonded material by connecting the first and second electrodes 129a and 129b of the LED chip 120 and the first and second upper pads 115a and 115b, and may be separate members for the connection. For example, when the first and second electrodes 129a and 129b and the first and second upper pads 115a and 115b are melted by a eutectic process, the connection bumps 139a and 139b may be implemented as the metal bonded material. Alternatively, the connection bumps 139a and 139b may be separate members including, e.g., solders including tin (Sn), epoxy resins having conductivity, or the like. In this case, materials of the connection bumps 139a and 139b are not limited to the exemplified solders and epoxy resins.

The underfill resin 130 may be disposed on the first upper pad 115a and the second upper pad 115b and may cover at least a portion of the side surface of the LED chip 120. The underfill resin 130 may be disposed on the first upper pad 115a, the second upper pads 115b, and an intermediate portion of the board body 111 disposed between the first and second upper pads 115a and 115b. The underfill resin 130 may cover upper surfaces of the first and second upper pads 115a and 115b. The underfill resin 130 may be disposed on the upper surface of the circuit board 110, and may cover a side surface of the semiconductor stack structure SL. The underfill resin 130 may cover the side, e.g., lateral, surface of the semiconductor stack structure SL and the first and second electrodes 129a and 129b. The underfill resin 130 may cover the connection bumps 139a and 139b. The underfill resin 130 may be filled between the stepped structure on the side surface of the LED chip 120 and the passivation layer 140, e.g., the underfill resin 130 may completely fill the stepped structure on the side surface of the LED chip 120 and any empty spaces between the substrate 121 and the circuit board 110. Since the underfill resin 130 is filled between the stepped structure on the side surface of the LED chip 120 and the passivation layer 140, e.g., so an empty space between the passivation layer 140 and the LED chip 120 may be prevented, reliability of the semiconductor light emitting device package by the passivation layer 140 may be improved.

In detail, the underfill resin 130 may cover the side surface of the semiconductor stack structure SL between the substrate 121 and the circuit board 110. In an example embodiment, the underfill resin 130 may be disposed between a lower surface of the substrate 121 and the upper surface of the circuit board 110, and may cover the first and second conductivity-type semiconductor layers 123 and 127 and the active layer 125. In this specification, the lower surface of the substrate 121 may refer to a surface of the substrate 121 close to the upper surface of the circuit board 110, and the upper surface of the substrate 121 may refer to a surface of the substrate 121 disposed far from the upper surface of the circuit board 110. In this embodiment, a height of the underfill resin 130 is illustrated to be lower than a height of the upper surface of the substrate 121, e.g., relative to the board body 111, but is not limited thereto.

The underfill resin 130 may be formed of a material having low ultraviolet-induced degradation and high ultraviolet light transmittance. For example, the underfill resin 130 may include silicone or a fluoropolymer. The fluoropolymer may include, e.g., polytetrafluoroethylene (PTFE) or Teflon®. Since the underfill resin 130 formed of a material having high ultraviolet light transmittance covers at least a portion of the side surface of the LED chip 120, light output of the LED chip 120 may be improved.

The passivation layer 140 may be disposed on the underfill resin 130. The passivation layer 140 may be disposed on the circuit board 110, and may cover the underfill resin 130. The passivation layer 140 may cover, e.g., continuously, the underfill resin 130, and may extend to cover, e.g., continuously, the upper surface of the circuit board 110. In an example embodiment, the passivation layer 140 may be disposed on the underfill resin 130 and the LED chip 120, e.g., the passivation layer 140 may extend continuously along external lateral surfaces of the underfill resin 130 and along lateral and upper surfaces of the LED chip 120. In an example embodiment, the passivation layer 140 may cover the, e.g., entire, second surface S2 of the LED chip 120. In an example embodiment, the passivation layer 140 may cover the upper surface of the substrate 121. In an example embodiment, the passivation layer 140 may be in, e.g., direct, contact with the second surface S2 of the LED chip 120 or the upper surface of the substrate 121. In an example embodiment, the passivation layer 140 may be in, e.g., direct, contact with a portion of a side surface of the substrate 121, but is not limited thereto. Since the passivation layer 140 is disposed on side and upper surfaces of the LED chip 120 to surround the LED chip 120, the LED chip 120 may be protected from external moisture or gas. Therefore, reliability of the semiconductor light emitting device package may increase.

The passivation layer 140 may be disposed to be spaced apart from the semiconductor stack structure SL. The underfill resin 130 may be disposed between the passivation layer 140 and the semiconductor stack structure SL. The passivation layer 140 may be disposed to be spaced apart from the first and second electrodes 129a and 129b. The passivation layer 140 may be disposed to be spaced apart from the connection bumps 139a and 139b.

The passivation layer 140 may include, e.g., at least one of $Al_2O_3$, AlN, $SiO_2$, $Si_3N_4$, or $HfO_2$. For example, the passivation layer 140 may include aluminum oxide, e.g., $Al_2O_3$. The passivation layer 140 is illustrated as a single layer, but is not limited thereto, and may be formed as a plurality of layers according to embodiments.

A thickness t of the passivation layer 140 may be, e.g., about 10 nm or more. The thickness t of the passivation layer 140 may be, e.g., in a range of about 10 nm or more and about 100 nm or less. The thickness t of the passivation layer 140 may be, e.g., about 10 nm or more and about 50 nm or less. When the thickness t of the passivation layer 140 is less than the above range, it may be difficult to prevent the LED chip 120 from being damaged by external moisture or gas.

Hereinafter, components modified from FIG. 1 will mainly be described, and descriptions of the same components will be omitted.

Figure 2:
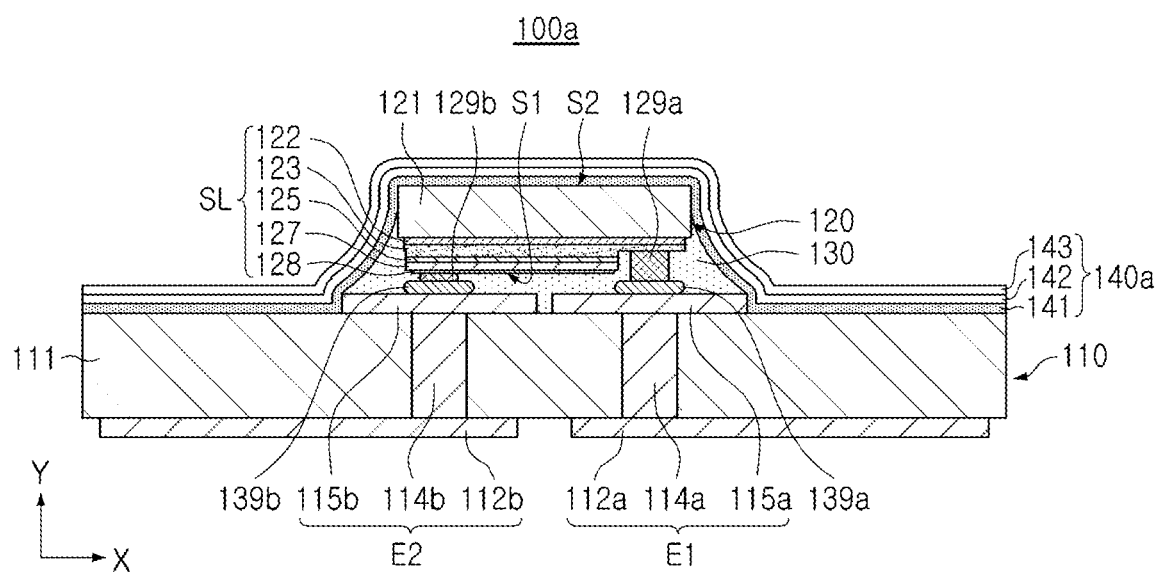
FIG. 2 is a cross-sectional view of a semiconductor light emitting device package according to an embodiment.

FIG. 2 is a cross-sectional view of a semiconductor light emitting device package according to an embodiment. FIG. 2 illustrates a modified example of the passivation layer 140 of FIG. 1.

Referring to FIG. 2, in a semiconductor light emitting device package 100a according to this embodiment, a passivation layer 140a may include a plurality of layers 141, 142, and 143. The plurality of passivation layers 141, 142, and 143 may include, e.g., at least one of $Al_2O_3$, AlN, $SiO_2$, $Si_3N_4$, or $HfO_2$. At least one of the plurality of layers 141, 142 and 143 of the passivation layer 140a may include aluminum oxide, e.g., $Al_2O_3$. The passivation layer 140a may include first to third passivation layers 141, 142, and 143. The first to third passivation layers 141, 142, and 143 may include a first material having a high refractive index and a second material having a low refractive index. The passivation layer 140a may be formed by alternately stacking a first material having a high refractive index and a second material having a low refractive index. At least one of the first to third passivation layers 141, 142, and 143 may include aluminum oxide. For example, the first and third passivation layers 141 and 143 may include silicon oxide, and the second passivation layer 142 may include aluminum oxide. For example, the first and third passivation layers 141 and 143 may include hafnium oxide, and the second passivation layer 142 may include aluminum oxide. Combination of the first to third passivation layers 141, 142, and 143 is not limited to the illustrated one, and may be variously changed. The number of layers of the plurality of passivation layers 141, 142, and 143 is not limited to the illustrated one, and may be variously changed.

Figure 3:
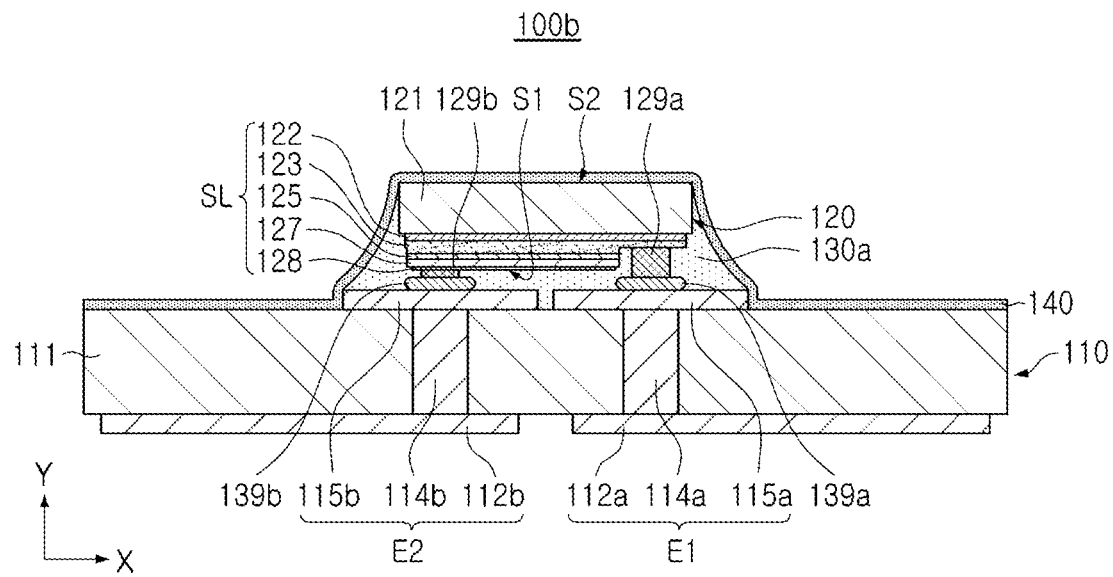
FIG. 3 is a cross-sectional view of a semiconductor light emitting device package according to an embodiment.

FIG. 3 is a cross-sectional view of a semiconductor light emitting device package according to an embodiment. FIG. 3 illustrates a modified example of the underfill resin 130 of FIG. 1.

Referring to FIG. 3, in a semiconductor light emitting device package 100b according to this embodiment, an underfill resin 130a may be disposed on an upper surface of the circuit board 110, and may cover a side surface of the LED chip 120. In an example embodiment, the underfill resin 130a may be disposed on the upper surface of the circuit board 110, and may cover a side surface of the substrate 121 and a side surface of the semiconductor stack structure SL. The underfill resin 130a may cover the side surface of the semiconductor stack structure SL and the first and second electrodes 129a and 129b. The underfill resin 130a may cover the connection bumps 139a and 139b. In this embodiment, a height of the underfill resin 130a may be substantially the same as a height of the upper surface of the substrate 121. For example, the underfill resin 130a may entirely cover the side surface of the LED chip 120.

Figure 4:
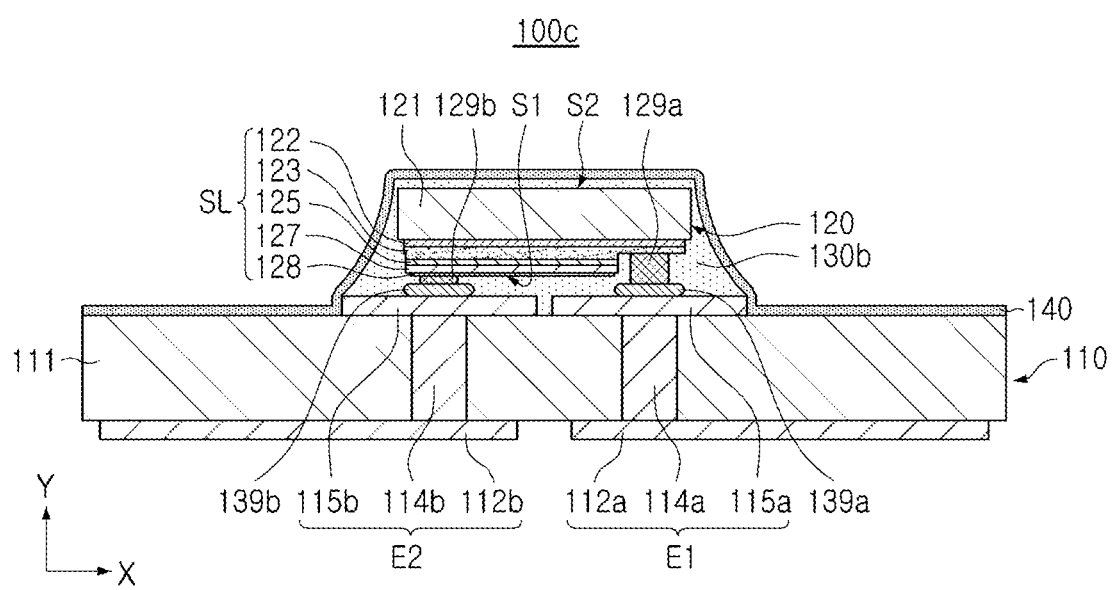
FIG. 4 is a cross-sectional view of a semiconductor light emitting device package according to an embodiment.

FIG. 4 is a cross-sectional view of a semiconductor light emitting device package according to an embodiment. FIG. 4 illustrates a modified example of the underfill resin 130 of FIG. 1.

Referring to FIG. 4, in a semiconductor light emitting device package 100c according to this embodiment, an underfill resin 130b may be disposed on an upper surface of the circuit board 110, and may cover a side surface and the second surface S2 of the LED chip 120. In an example embodiment, the underfill resin 130b may be disposed on the upper surface of the circuit board 110, and may cover a side surface of the substrate 121 and the upper surface of the substrate 121. In an example embodiment, a height of the underfill resin 130b may be higher than a height of the upper surface of the substrate 121. In an example embodiment, a thickness t2 of an upper portion 130U of the underfill resin 130b covering the upper surface of the substrate 121 may be less than a thickness t1 of the passivation layer 140, but is not limited thereto.

Figure 5:
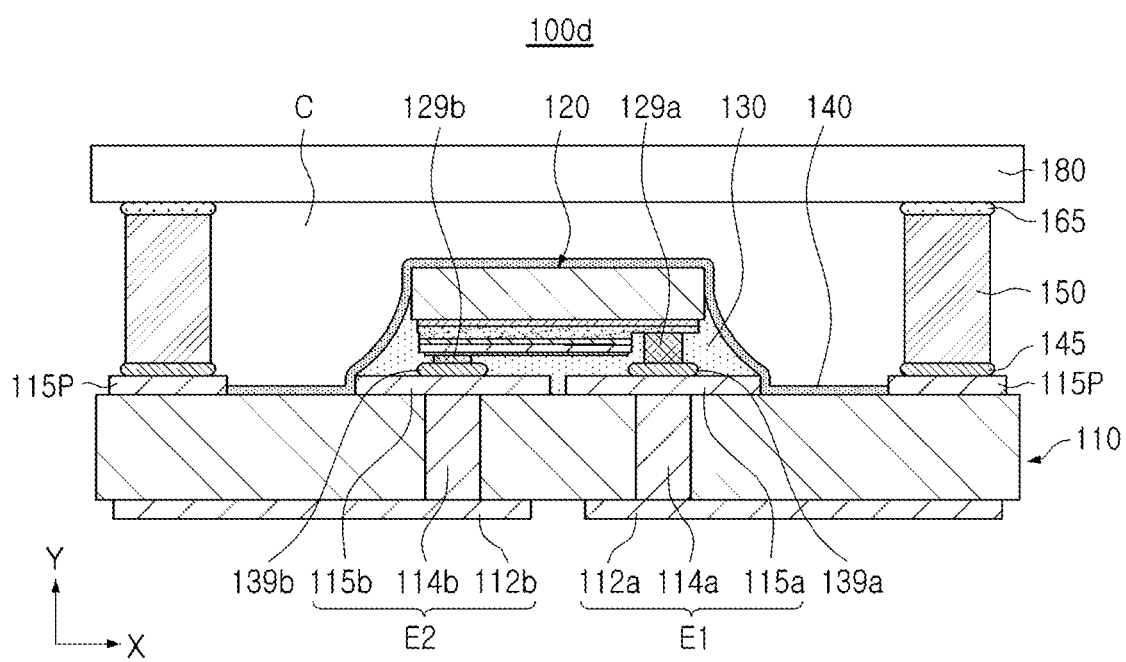
FIG. 5 is a cross-sectional view of a semiconductor light emitting device package according to an embodiment.

FIG. 5 is a cross-sectional view of a semiconductor light emitting device package according to an embodiment.

Referring to FIG. 5, a semiconductor light emitting device package 100d may include the circuit board 110 having the first and second electrode structures E1 and E2, the LED chip 120 mounted on the circuit board 110 and electrically connected to the first and second electrode structures E1 and E2, a side structure 150 disposed on the circuit board 110 and providing a cavity C surrounding the LED chip 120, and a glass cover 180 disposed on the side structure 150 to seal the cavity C.

First and second upper pads 115a and 115b and a support pad 115P surrounding the LED chip 120 may be disposed on an upper surface of the board body 111. The support pad 115P may be formed, together with the first and second upper pads 115a and 115b. For example, the support pad 115P may include the same metal layer as metal layers of the first and second upper pads 115a and 115b. The board body 111 may include, e.g., a ceramic material having a thermal conductivity of 100 W/m·K or more. For example, the ceramic body 111 may include aluminum nitride, aluminum oxide, or silicon carbide.

The glass cover 180 may be used as a component replacing an encapsulant. As the glass cover 180, a material having a transmittance of 70% or, e.g., 85% or more, in a wavelength band of 200 nm to 300 nm may be used. For example, the glass cover 180 may include quartz, fused silica glass, calcium fluoride glass ($CaF_2$ glass), magnesium fluoride glass, or borosilicate glass.

The side structure 150 may be disposed on the circuit board 110, and may have the cavity C surrounding the LED chip 120. The side structures 150 may be respectively bonded to the circuit board 110 and the glass cover 180. Such bonding may be implemented by first and second hermetic seal bonding layers 145 and 165. The bonded side structure 150 may be used as a support structure in which the glass cover 180 maintains a constant distance from the circuit board 110. In this manner, the cavity C by the side structure 150 may be provided as a mounting space for the LED chip 120 sealed to prevent penetration of external moisture or the like. In this embodiment, the passivation layer 140 disposed on the LED chip 120 may be provided in the cavity C sealed by the side structure 150 and the glass cover 180, to increase reliability of the semiconductor light emitting device package.

The side structure 150 may be formed of a material having an appropriate thermal expansion coefficient to maintain a reliable bonding between a ceramic material of the circuit board 110 and a glass material of the glass cover 180. As the side structure 150, an alloy having a thermal expansion coefficient of 10 ppm/° C. or less may be used. The side structure 150 may have a relatively lower Young's modulus than a ceramic material (e.g., AlN: about 320 GPa), to alleviate stress caused by mismatching of thermal expansion coefficients. The side structure 150 may include an alloy having a Young's modulus of 300 Gpa or less. In some embodiments, the side structure 150 may include an alloy having a Young's modulus in a range of 100 to 200 Gpa. For example, the side structure 150 may include at least one of an Fe—Ni alloy, a Fe—Ni—Co alloy, or a CuW alloy. Invar alloy may be used as the Fe—Ni alloy, and Kovar alloy may be used as the Fe—Ni—Co alloy.

As described above, the semiconductor light emitting device package 100d according to this embodiment may include the first and second hermetic seal bonding layers 145 and 165 to provide the cavity C as a sealed space. The first hermetic seal bonding layer 145 may be disposed between the support pad 115P and a lower surface of the side structure 150, to bond the circuit board 110 and the side structure 150. For example, the first hermetic bonding layer 145 may be implemented by a brazing process, a welding process, or a soldering process. For example, an Ag-based filler may be used for the brazing process, and Ni/Au may be used for the welding process. In addition, as the soldering process, a eutectic metal, e.g., Au/Ge, Au/In, or Au/Sn may be used.

FIGS. 6A to 6D are cross-sectional views of stages in a method of manufacturing a semiconductor light emitting device package according to an embodiment.

Figure 6A:
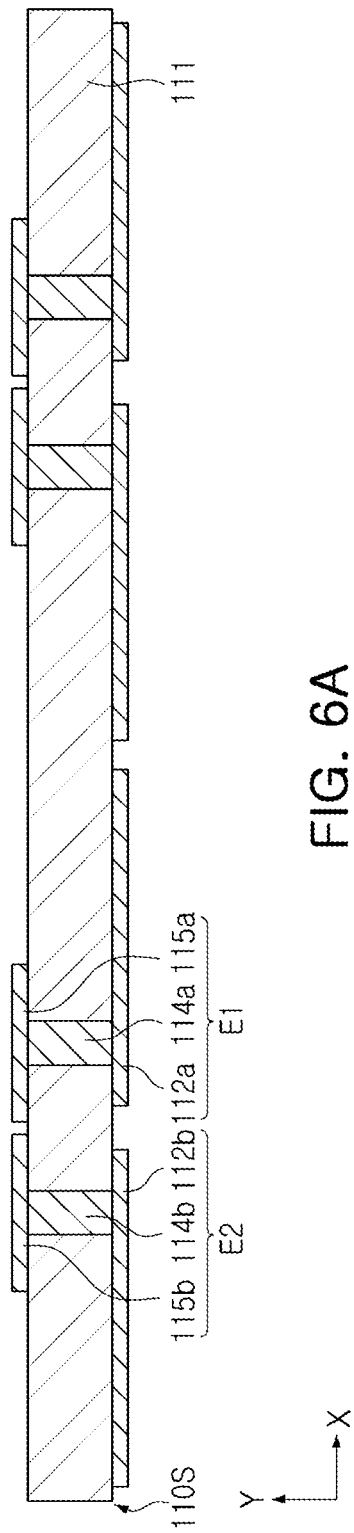
FIGS. 6A to 6D are cross-sectional views of stages in a method of manufacturing a semiconductor light emitting device package according to an embodiment.

Referring to FIG. 6A, a base substrate 110S having a plurality of the circuit boards 110 illustrated in FIG. 1 may be provided. The base substrate 110S may include the board body 111.

The first and second electrode structures E1 and E2 may be formed in each of the circuit boards. The first and second electrode structures E1 and E2 may include the first and second upper pads 115a and 115b disposed on an upper surface of the board body 111, the first and second lower pads 112a and 112b disposed on a lower surface of the board body 111, and the first and second through-electrodes 114a and 114b passing through the board body 111 and respectively connected to the first and second upper pads 115a and 115b and the first and second lower pads 112a and 112b, respectively. The first and second electrode structures E1 and E2 may include a conductive material, e.g., Au, Ag, Cu, Zn, Al, In, Ti, Si, Ge, Sn, Mg, Ta, Cr, W, Ru, Rh, Ir, Ni, Pd, or Pt, as a single layer structure or a multilayer structure. The first and second electrode structures E1 and E2 may be formed by a plating process using a metal, e.g., copper (Cu).

Figure 6B:
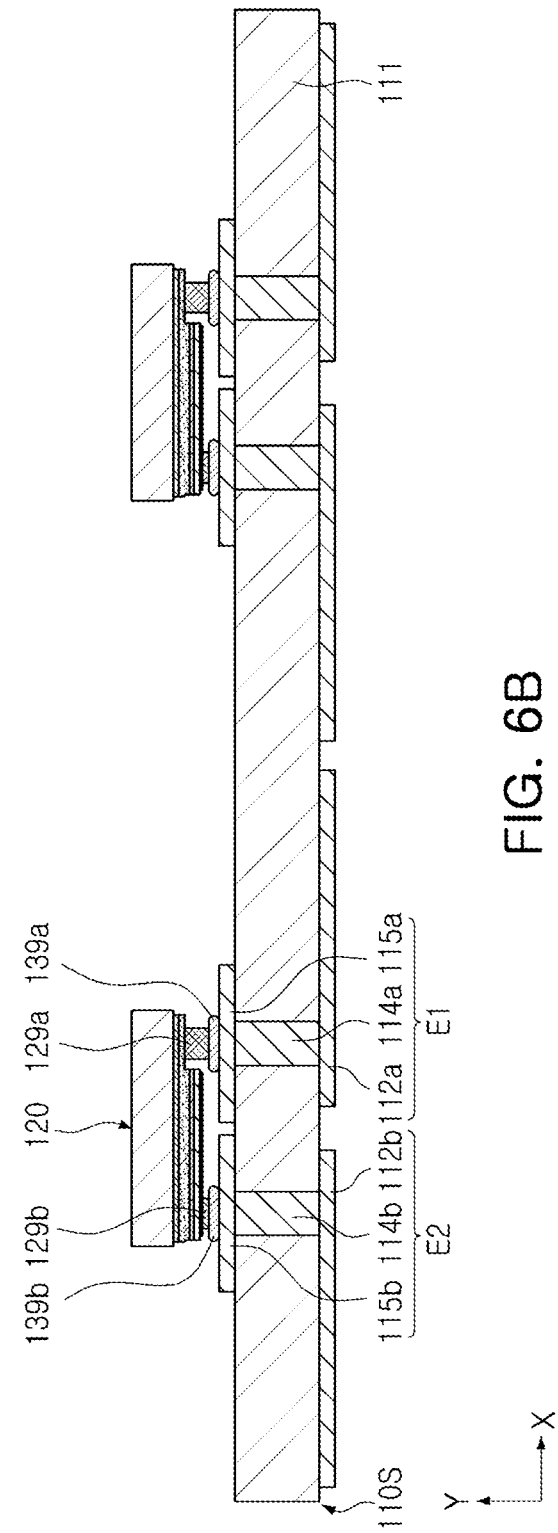

Next, referring to FIG. 6B, a plurality of LED chips 120 may be mounted on the base substrate 110S, respectively. The plurality of LED chips 120 may be mounted on the base substrate 110S using the connection bumps 139a and 139b, to respectively connect the first and second electrodes 129a and 129b of the LED chip 120 to the first and second upper pads 115a and 115b.

Figure 6C:
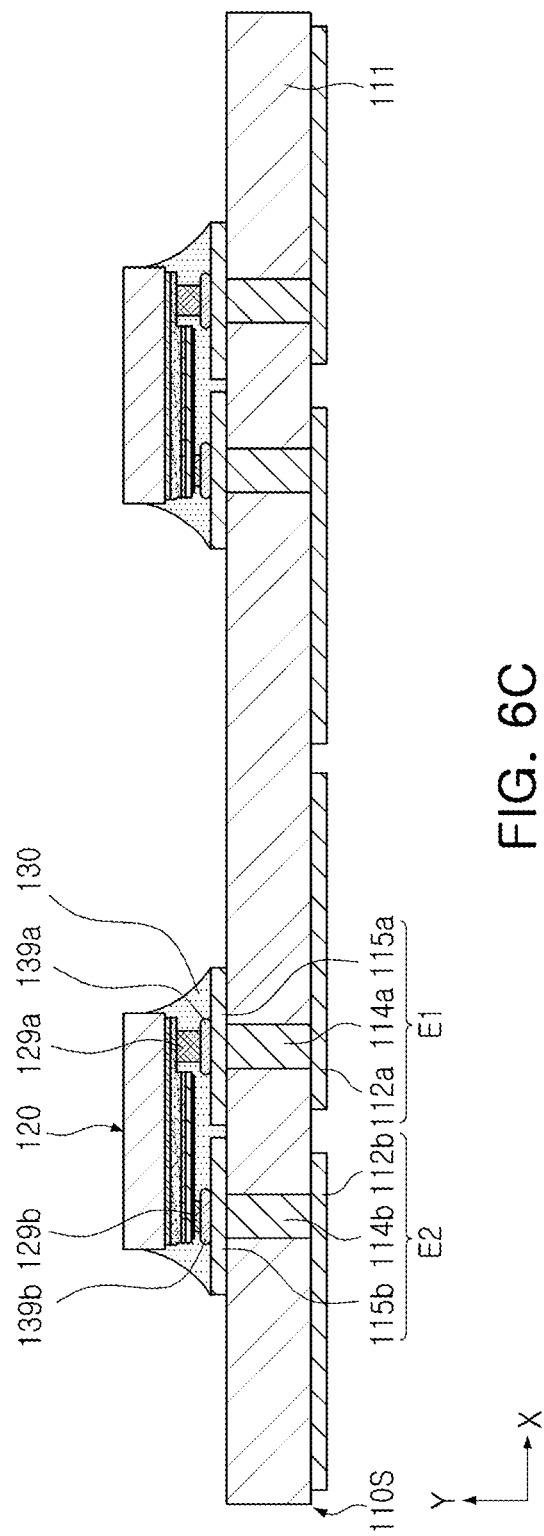

Next, referring to FIG. 6C, the underfill resin 130 may be formed on the first and second upper pads 115a and 115b to cover at least a portion of a side surface of the LED chip 120. The underfill resin 130 may be formed of a material having low ultraviolet-induced degradation and high ultraviolet light transmittance. For example, the underfill resin 130 may include a fluoropolymer. For example, the underfill resin 130 may include polytetrafluoroethylene (PTFE) or Teflon®.

Figure 6D:
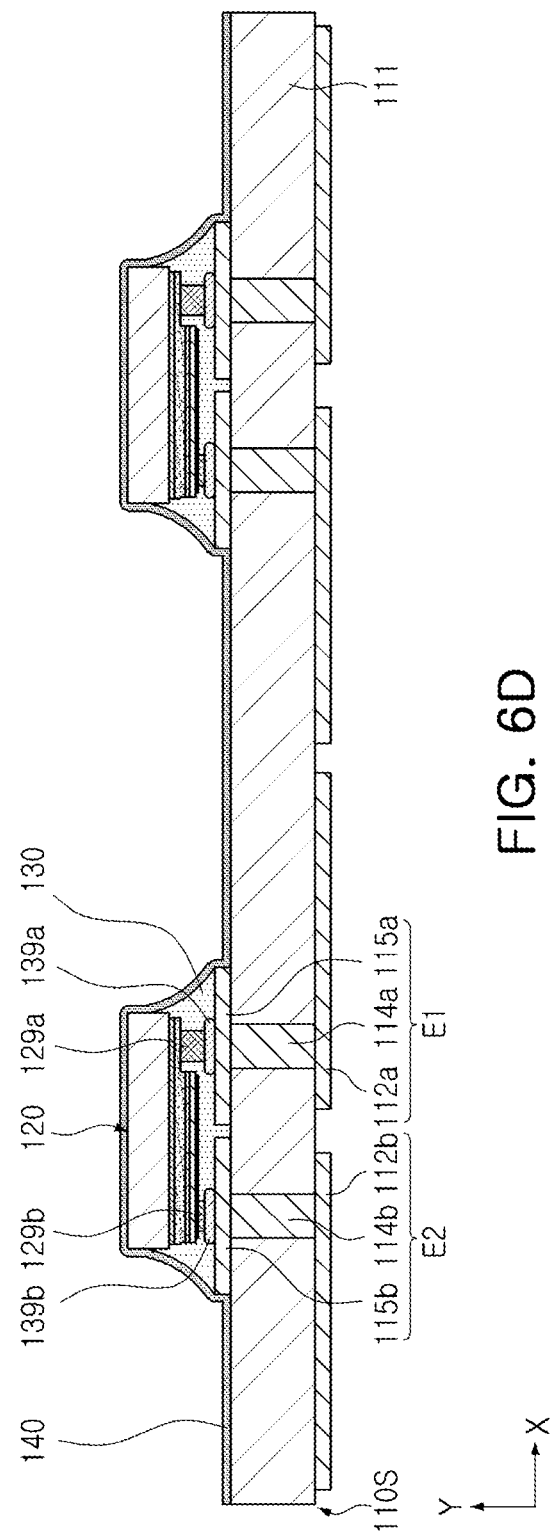

Next, referring to FIG. 6D, the passivation layer 140 may be formed on the base substrate 110S, the underfill resin 130, and the LED chips 120. Since the passivation layer 140 is formed after configuring the underfill resin 130 to cover the side surface of the LED chip 120, the passivation layer 140 may be conformally formed on the underfill resin 130. Since the underfill resin 130 is formed before forming the passivation layer 140, an empty space between the passivation layer 140 and the LED chip 120 due to a stepped structure on the side surface of the LED chip 120 may not occur. For example, the underfill resin 130 may be filled between the passivation layer 140 and the LED chip 120. The passivation layer 140 may be formed to include, e.g., at least one of $Al_2O_3$, AlN, $SiO_2$, $Si_3N_4$, or $HfO_2$. The passivation layer 140 may be formed to include at least aluminum oxide, e.g., $Al_2O_3$. The passivation layer 140 may be formed as a single layer or a plurality of layers. A thickness t of the passivation layer 140 may be, e.g., about 10 nm or more.

By way of summation and review, embodiments provide a highly reliable semiconductor light emitting device package. That is, by including the underfill resin 130 covering a side surface of the LED chip 120 mounted on a circuit board and the passivation layer 140 disposed on the underfill resin 130, a highly reliable semiconductor light emitting device package may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device package, comprising:
    a circuit board including an upper pad;
    a light emitting diode chip on the circuit board, the light emitting diode chip having a first surface facing the circuit board and a second surface opposing the first surface, and the light emitting diode chip including:
        a substrate,
        a semiconductor stack structure on the substrate, the semiconductor stack structure being configured to emit ultraviolet light, and
        electrodes connected to the semiconductor stack structure;
    connection bumps between the circuit board and the light emitting diode chip, the connection bumps connecting the upper pad and the electrodes;
    an underfill resin on the upper pad of the circuit board, the underfill resin covering at least a portion of a side surface of the light emitting diode chip; and
    a passivation layer on the light emitting diode chip and the underfill resin, the passivation layer covering the underfill resin and being spaced apart from the semiconductor stack structure, wherein the passivation layer directly contacts the underfill resin and an upper surface of the light emitting diode chip.

2. The semiconductor light emitting device package as claimed in claim 1,
wherein the passivation layer covers the second surface of the light emitting diode chip.

3. The semiconductor light emitting device package as claimed in claim 1,
wherein the passivation layer is spaced apart from the electrodes.

4. The semiconductor light emitting device package as claimed in claim 1,
wherein the underfill resin covers the semiconductor stack structure, the electrodes, and the connection bumps.

5. The semiconductor light emitting device package as claimed in claim 1,
wherein the underfill resin is between the substrate and the circuit board, the underfill resin covering a side surface of the semiconductor stack structure.

6. The semiconductor light emitting device package as claimed in claim 1,
wherein the passivation layer includes at least one of Al2O3, AlN, SiO2, Si3N4, and HfO2.

7. The semiconductor light emitting device package as claimed in claim 1,
wherein the passivation layer includes a plurality of layers, at least one of the plurality of layers including Al2O3.

8. The semiconductor light emitting device package as claimed in claim 1,
wherein the passivation layer has a thickness of about 10 nm or more.

9. The semiconductor light emitting device package as claimed in claim 1,
wherein the underfill resin includes a fluoropolymer or silicone.

10. The semiconductor light emitting device package as claimed in claim 1,
wherein the passivation layer extends onto an upper surface of the circuit board to cover a portion of the upper surface of the circuit board.

11. The semiconductor light emitting device package as claimed in claim 1, further comprising:
a side structure on the circuit board, the side structure defining a cavity surrounding the light emitting diode chip; and
a glass cover on the side structure to seal the cavity.

12. The semiconductor light emitting device package as claimed in claim 1,
wherein:
the semiconductor stack structure includes a first conductivity-type semiconductor layer on the substrate, an active layer on the first conductivity-type semiconductor layer, and a second conductivity-type semiconductor layer on the active layer, and
the electrodes include a first electrode connected to the first conductivity-type semiconductor layer, and a second electrode connected to the second conductivity-type semiconductor layer.

13. A semiconductor light emitting device package, comprising:
a circuit board;
a light emitting diode chip on the circuit board, the light emitting diode chip having a first surface facing the circuit board and a second surface opposing the first surface, and the light emitting diode chip being configured to emit ultraviolet light;
an underfill resin on the circuit board and covering at least a portion of a side surface of the light emitting diode chip; and
a passivation layer on the light emitting diode chip and the underfill resin, the passivation layer covering the second surface of the light emitting diode chip and the underfill resin, wherein the passivation layer directly contacts the underfill resin and an upper surface of the light emitting diode chip.

14. The semiconductor light emitting device package as claimed in claim 13, wherein:
the light emitting diode chip includes a substrate, a first conductivity-type semiconductor layer and a second conductivity-type semiconductor layer on the substrate, and an active layer between the first conductivity-type semiconductor layer and the second conductivity-type semiconductor layer, and
the passivation layer covers an upper surface of the substrate.

15. The semiconductor light emitting device package as claimed in claim 14, wherein the underfill resin covers the first conductivity-type semiconductor layer, the second conductivity-type semiconductor layer, and the active layer, between a lower surface of the substrate and the circuit board.

16. The semiconductor light emitting device package as claimed in claim 14, wherein a height of the underfill resin is lower than a height of the upper surface of the substrate.

17. The semiconductor light emitting device package as claimed in claim 14, wherein a height of the underfill resin is higher than a height of the upper surface of the substrate.

18. The semiconductor light emitting device package as claimed in claim 14, wherein a height of the underfill resin is substantially equal to a height of the upper surface of the substrate.

19. The semiconductor light emitting device package as claimed in claim 13, wherein the underfill resin includes a fluoropolymer, and the passivation layer includes aluminum oxide.

20. A semiconductor light emitting device package, comprising:
a circuit board including an upper pad;
a light emitting diode chip on the circuit board, the light emitting diode chip having a first surface facing the circuit board and a second surface opposing the first surface, and the light emitting diode chip including:
a substrate,
a semiconductor stack structure on the substrate and configured to emit ultraviolet light, and
electrodes connected to the semiconductor stack structure;
connection bumps between the circuit board and the light emitting diode chip, the connection bumps connecting the upper pad and the electrodes;
an underfill resin on the upper pad of the circuit board, the underfill resin covering a side surface of the semiconductor stack structure and the connection bumps, and the underfill resin including a fluoropolymer; and
a passivation layer covering the second surface of the light emitting diode chip and the underfill resin, the passivation layer extending onto an upper surface of the circuit board, and the passivation layer including at least aluminum oxide.

* * * * *